(12) United States Patent
Fröhlich et al.

(10) Patent No.: US 6,750,554 B2
(45) Date of Patent: Jun. 15, 2004

(54) MARK CONFIGURATION, WAFER WITH AT LEAST ONE MARK CONFIGURATION AND METHOD FOR THE FABRICATION OF AT LEAST ONE MARK CONFIGURATION

(75) Inventors: Hans-Georg Fröhlich, Dresden (DE); Uwe Paul Schröder, Langebrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/244,281

(22) Filed: Sep. 16, 2002

(65) Prior Publication Data

US 2003/0052421 A1 Mar. 20, 2003

(30) Foreign Application Priority Data

Sep. 14, 2001 (DE) .......................... 101 47 226

(51) Int. Cl.[7] .............................. H01L 23/544
(52) U.S. Cl. ...................... 257/797; 438/401
(58) Field of Search .................. 257/797; 438/401, 438/462

(56) References Cited

U.S. PATENT DOCUMENTS

| | | | |
|---|---|---|---|
| 5,898,227 A | | 4/1999 | Geffken et al. |
| 6,288,454 B1 | * | 9/2001 | Allman |
| 6,344,697 B2 | * | 2/2002 | Sugiyama |
| 6,486,565 B2 | * | 11/2002 | Miyako |
| 6,489,216 B1 | * | 12/2002 | Shiu et al. |

* cited by examiner

*Primary Examiner*—Sheila V. Clark
(74) *Attorney, Agent, or Firm*—Laurence A. Greenberg; Werner H. Stemer; Ralph E. Locher

(57) ABSTRACT

A mark configuration is provided for the orientation and/or determination of the relative position of a substrate and/or of layers on the substrate during a lithographic exposure, in particular for the case of a wafer during the fabrication of DRAMs. At least one part of a mark is disposed above a patterned background for the purpose of increasing a difference in contrast between the mark and the substrate. A wafer can also be manufactured with such a mark configuration. A method for fabricating the mark configuration is also described. An efficient and simple orientation of layers and/or of the substrate is thus made possible.

23 Claims, 4 Drawing Sheets

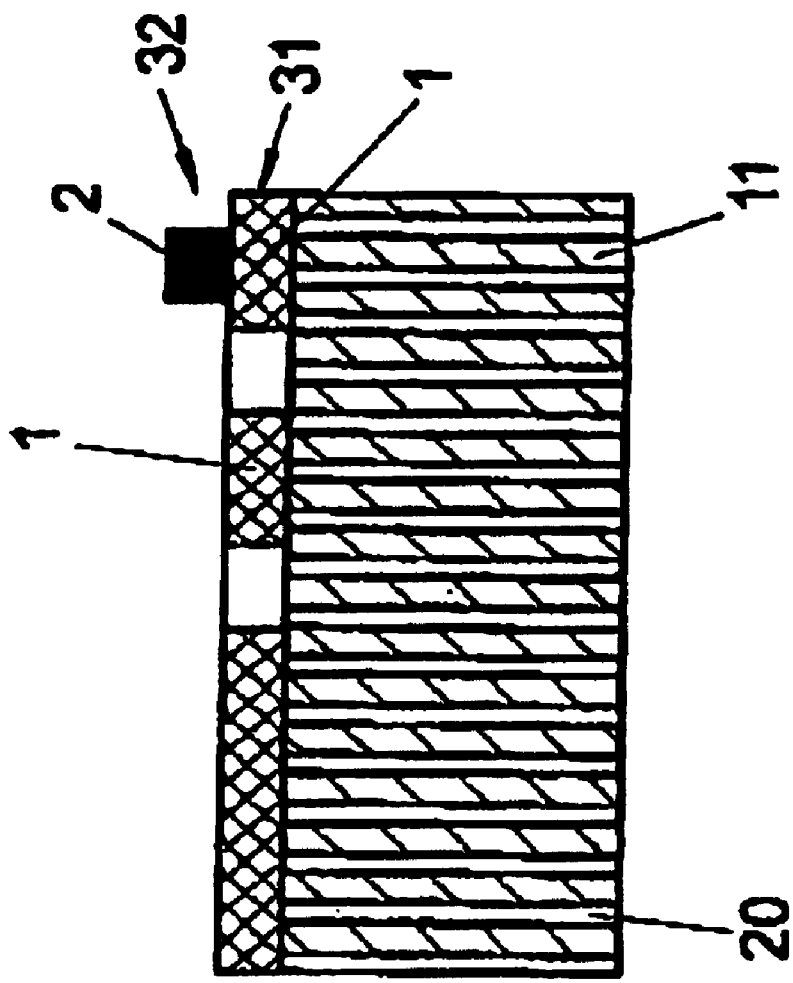

MARK CONFIGURATION, WAFER WITH AT LEAST ONE MARK CONFIGURATION AND METHOD FOR THE FABRICATION OF AT LEAST ONE MARK CONFIGURATION

BACKGROUND OF THE INVENTION

Field of the Invention

The invention relates to a mark configuration for the orientation and/or determination of the relative position of a substrate and/or of layers on the substrate during a lithographic exposure. The mark configuration can be formed on a wafer for the production of dynamic random access memories.

During the fabrication of semiconductor components, structures are formed in different planes, which are applied successively on a substrate and then altered in each case by further processing steps. The processing steps include e.g. deposition steps, photomasking steps, resist development and resist patterning steps.

As a result of the ever decreasing dimensions of the structures, it is necessary for sequentially applied layers to be oriented exactly to one another, since otherwise the function of the semiconductor components is not ensured.

The structures are fabricated using an exposure tool, the exposure acting on a photosensitive resist (photoresist) that is applied to the substrate (e.g. wafer). The substrate is loaded into the exposure tool. Using alignment marks on the substrate, the exposure tool identifies defined positions. The substrate is oriented and exposed on the basis of the values determined using the alignment marks. The exposure produces structure alterations in the photoresist, which are transferred to a structure in the semiconductor component in subsequent processing steps.

Special measurement marks in the photoresist are used to determine whether the orientation of the layers has been performed with sufficiently high register accuracy. If the register accuracy is not sufficient, then the resist layer can be removed again. A new exposure with a new orientation of the substrate then takes place (rework).

One possibility for identifying the position of the marks consists in an optical evaluation. To that end, monochromatic or white light is radiated onto the substrate and the reflected light is evaluated e.g. by an image identification. In this case, the efficiency of the evaluation depends on the differences in contrast in the image. In this case, the contrast is defined as the ratio of the difference between the maximum and minimum intensity to the sum of the maximum and minimum intensity.

Usually, the differences in contrast on the substrate are produced by step heights or varying reflectivity of mark structure and surroundings.

However, these differences in contrast often do not suffice to enable an evaluation and thus a good orientation or checking of the substrate.

Moreover, an unfavorable sequence of the processing steps, e.g. a CMP step carried out beforehand, can impair the difference in contrast between the mark and the surroundings.

SUMMARY OF THE INVENTION

It is accordingly an object of the invention to provide a mark configuration, a wafer with at least one mark configuration and a method for the fabrication of the mark configuration which overcome the above-mentioned disadvantages of the prior art devices and methods of this general type, such that an orientation of layers and/or of the substrate is possible in a simple and efficient manner.

With the foregoing and other objects in view there is provided, in accordance with the invention, a mark configuration for orientation and/or determination of a relative position of a substrate and/or layers on the substrate during a lithographic exposure. The mark configuration contains a patterned background in or on the substrate, and a mark having at least one part disposed above the patterned background. The mark increases a difference in contrast between the mark and the substrate.

By virtue of the fact that at least one part of a mark is disposed above a patterned background, the contrast of the mark relative to the substrate is improved.

In one advantageous refinement of the mark configuration according to the invention, a first mark, in particular as an alignment mark or part of a measurement mark in a first layer, is disposed above the patterned background. An alignment mark serves for orienting the substrate during an exposure in an exposure tool. However, the first mark may serve as part of a measurement mark, together with marks applied later, for enabling a relative orientation of layers with respect to one another. In this case, the improved contrast always allows a better identification of the position of the substrate or of the layers on the substrate.

It is also advantageous if a second mark, as a measurement mark or part of a measurement mark in a second layer, in particular a photoresist layer, is disposed above the patterned background, the second mark being disposed in such a way that the orientation of the second layer with respect to the first layer can be quantitatively detected. As a result, after an exposure, it is possible to detect whether the latter has been performed correctly.

An advantageous mark configuration is also present if the first mark is configured as an alignment mark that forms a measurement mark together with the second mark. As a result, the alignment mark is used doubly, thereby obviating the provision of a first part of a measurement mark.

In order to increase the contrast, it is advantageous if the patterned background is disposed below the entire extent of at least one of the marks.

In one advantageous refinement of the mark configuration according to the invention, the patterned background has a regular, in particular a linear or grid-shaped, pattern. Such patterns can be fabricated relatively easily and the marks stand out well against the patterned background.

It is advantageous if the patterned background has at least one element whose reflectivity differs from that of the substrate. Differences in the reflectivity enable an efficient evaluation by light irradiation of the substrate. It is also advantageous if the patterned background has at least one elevation made of an oxide layer, monocrystalline silicon, polysilicon, aluminum and/or copper, since these elements, too, can be readily detected during an irradiation.

One embodiment of the mark configuration according to the invention advantageously has a patterned background with at least one depression, in particular a trench, a deep trench, and/or a multiplicity of holes. Altering the absorption by depressions also makes it possible to improve the efficiency of detection of the marks.

In this case, it is also advantageous if the pattern of the patterned background extends parallel to an axis, in particular the longitudinal axis of one of the marks, and/or perpendicular to the longitudinal axis of the mark.

Furthermore, it is advantageous if the dimensions of the individual elements of the patterned background lie below the resolution limit of a measuring apparatus for the detection of the marks.

For an efficient fabrication of the semiconductor components it is advantageous if at least one mark is disposed in a layer below the layer that is currently to be processed.

In the manufacture of the mark configuration, first a patterned background is fabricated on or in a substrate, in particular a semiconductor material, and then at least one part of a mark is disposed above the patterned background. This serves for producing an increased difference in contrast between mark and substrate.

In this case, it is advantageous if a first mark, in particular as an alignment mark or part of a measurement mark in a first layer, is disposed above the patterned background. Preferably, a second mark, as a measurement mark or part of a measurement mark in a second layer, in particular a photoresist layer, is also disposed above the patterned background.

A particularly effective improvement of the differences in contrast results if the patterned background is introduced as a regular, in particular a linear or grid-shaped, pattern onto and/or into the substrate. In this case, it is advantageous if at least one element of the patterned background whose reflectivity differs from that of the substrate is applied to the substrate. It is also advantageous if, for the patterned background, at least one elevation made of an oxide layer, monocrystalline silicon, polysilicon, aluminum and/or copper is applied to the substrate. In an advantageous manner, for the patterned background, at least one depression, in particular a trench, a deep trench, and/or a multiplicity of holes is introduced into the substrate.

Other features which are considered as characteristic for the invention are set forth in the appended claims.

Although the invention is illustrated and described herein as embodied in a mark configuration, a wafer with at least one mark configuration and a method for the fabrication of at least one mark configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a diagrammatic sectional view through a wafer with a further embodiment of the mark configuration according to the invention with a first and second mark;

DESCRIPTION OF THE PREFERRED EMBODIMENTS

Figure 1:
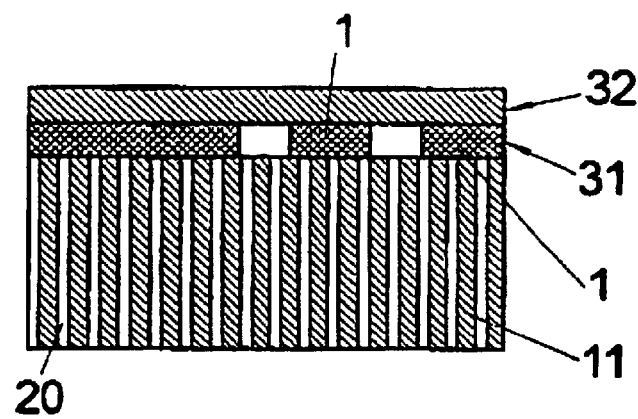
FIG. 1 is a diagrammatic sectional view through a wafer with an embodiment of the mark configuration according to the invention.

Referring now to the figures of the drawing in detail and first, particularly, to FIG. 1 thereof, there is shown a cross-sectional enlargement of a part of a wafer surface. Such wafers are used in particular in the fabrication of dynamic random access memories (DRAMs). For this exemplary embodiment, a wafer made of silicon is used as a substrate 20, other materials also being appropriate for the substrate in alternative embodiments.

In the substrate 20, semiconductor components are fabricated by a multiplicity of processing steps in a manner known per se.

The exposure steps during the fabrication of the semiconductor components require the substrate 20 (that is to say the wafer in this case) to be precisely oriented in a non-illustrated exposure tool.

A mark configuration with at least one first mark 1, also called an alignment mark, is used for this purpose.

In order to increase the difference in contrast, in the illustrated embodiment of the invention, the alignment mark 1 is disposed above regularly disposed depressions 11. The depressions 11, which are in this case embodied as deep trenches, thus form a patterned background 11 of the alignment marks 1. In alternative embodiments, the patterned background 11 has an array of holes (e.g. contact holes).

During an irradiation with light, the depressions 11 have a significantly different reflection behavior than the surrounding substrate 20, which contributes to the increased difference in contrast. A non-illustrated optical system for the orientation of an exposure unit, can identify the alignment marks 1. Examples of such sensing of the alignment marks are illustrated in FIG. 7.

In principle, however, the first mark 1 may be not only an alignment mark but also part of a measurement mark. In this case, the interaction of parts of the measurement marks in different layers is used to orient the layers among one another (see FIG. 6).

In FIG. 1, there is disposed above a first layer 31 in which the alignment mark 1 is disposed (in this case the first layer is the alignment mark plane), a second layer 32 made of photoresist, in which a second mark can be disposed (see FIG. 5).

The views illustrated in figures are not to scale. Typical dimensions of the width of the alignment marks 1 are 4 μm, and the distance between the alignment marks 1 is typically 20 μm. The deep trenches in this case have a width of 1 μm and are disposed at a regular distance of 1 μm from one another.

The alignment marks 1 are fabricated from tetraethylorthosilicate (TEOS) in the embodiment illustrated here. In principle, however, other materials are also suitable. Moreover, in alternative embodiments, the alignment marks 1 according to the invention can be used in connection with other materials, such as e.g. III-V semiconductors.

In this case, the improvement in contrast of the alignment mark 1 according to the invention relative to the background is, in principle, independent of the material chosen.

Figure 2:
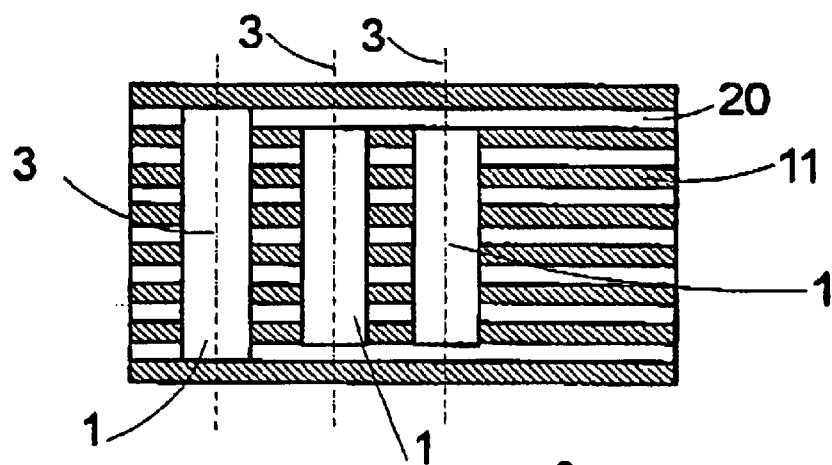
FIG. 2 is a diagrammatic plan view of an embodiment of the mark configuration according to the invention with underlying depressions transversely with respect to the longitudinal axis of a first mark.

FIG. 2 illustrates a diagrammatic plan view of three alignment marks 1 disposed above deep trenches in the form of the depressions 11. In this case, longitudinal axes 3 of the alignment marks 1 are situated transversely with respect to the deep trenches 11.

Figure 3:
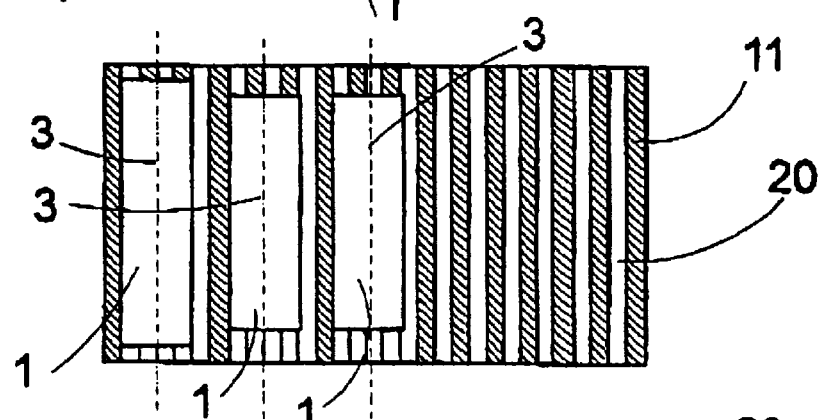
FIG. 3 is a diagrammatic plan view of an embodiment of the mark configuration according to the invention with underlying depressions parallel to the longitudinal axis of the first mark.

FIG. 3 illustrates essentially the same configuration as in FIG. 2, except that the longitudinal axes 3 of the alignment marks 1 are in this case disposed parallel to the deep trenches 11.

In both cases, the dimensions of the alignment marks 1 and of the deep trenches 11 correspond to the specifications made above.

Figure 4:
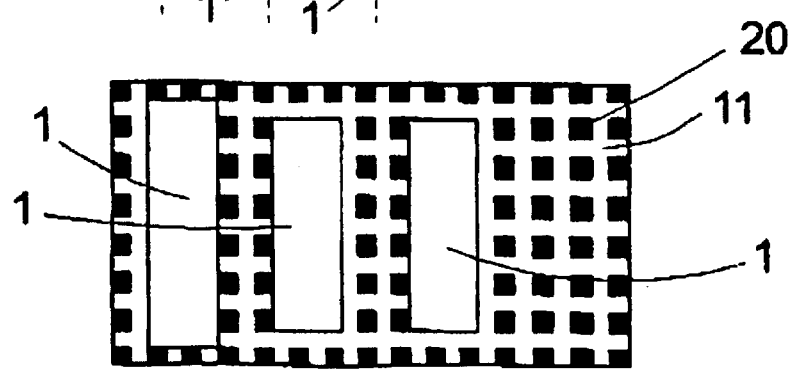
FIG. 4 is a diagrammatic plan view of an embodiment of the mark configuration according to the invention with underlying depressions in grid form.

Somewhat different dimensions are present in the case illustrated in FIG. 4. In this case, the alignment marks 1 are disposed above deep trenches 11 in a grid structure. In this case, the grid structure has squares with a side length of 400 nm. In contrast to FIGS. 1–3, for illustration reasons, the deep trenches 11 are shown light and the semiconductor material 20 dark.

FIG. 5 illustrates a sectional view with a mark configuration analogous to FIG. 1, in which a second mark 2 is disposed in addition to the first mark 1.

In this case, the first mark 1 is to be understood as a first part of a multilayer measurement mark.

The second mark 2 is disposed as a second part of the measurement mark above the first layer 31 in the second layer 32 (photoresist layer). In FIG. 5, the photoresist layer itself has already been etched away, so that only resist webs of the second mark 2 are present. As an alternative, it is also possible to introduce resist trenches.

Consequently, the first mark 1 and the second mark 2 (these together form the measurement mark) are disposed above the patterned background 11, which contributes to the improvement of the difference in contrast.

In FIG. 5, the first layer 31 and the second layer 32 are disposed directly one above the other. As an alternative, one or more layers may be located between the layers 31, 32 in which the marks 1, 2 are located, if one or more layers are sufficiently transparent.

The function of the multipart measurement mark 1, 2 is illustrated with reference to FIGS. 6A–6C, which simultaneously specify method steps of the fabrication of a mark configuration according to the invention.

Figure 6A:
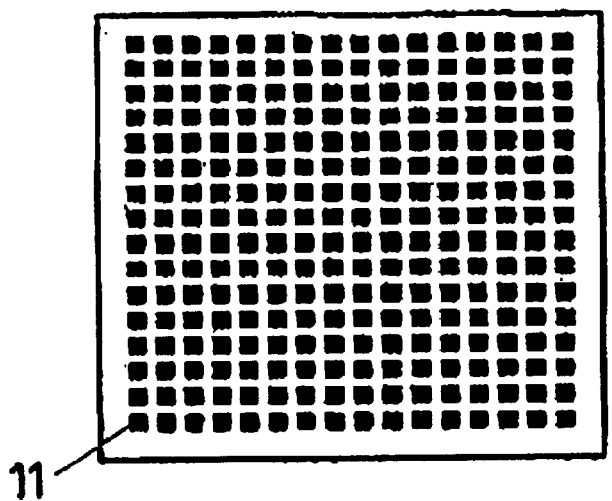
FIGS. 6A–6c are diagrammatic plan views of three fabrication steps of the embodiment according to FIG. 5.

FIG. 6A illustrates a detail from a substrate into which is applied, in grid form, the material 11 as the patterned background, which has a different reflection behavior than the substrate. In the present case, these are slight elevations made of silicon. As an alternative, other patternable materials can also be used.

Figure 6B:
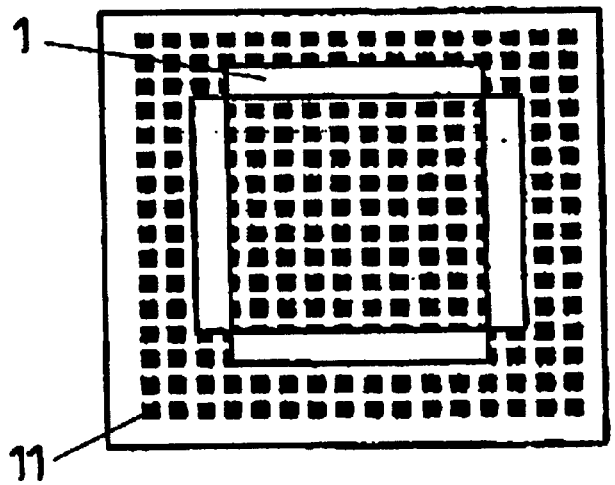

FIG. 6B illustrates how the first mark 1 is disposed above the patterned background. The first mark 1 is a part of a measurement mark in FIG. 5.

As an alternative, an already existing alignment mark (the exposure tool can correctly orient the substrate using the alignment marks) may also serve as part of the measurement mark.

Figure 6C:
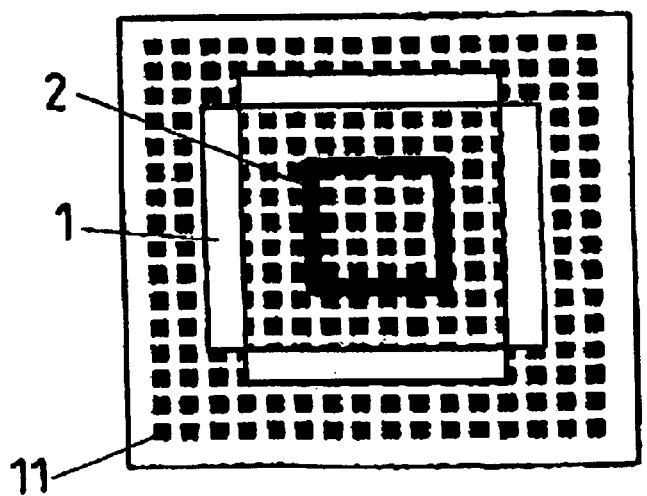

FIG. 6C then illustrates the case after the exposure, in which the second mark 2 is disposed as the second layer (see FIG. 5) above the patterned background. In this case, the second mark 2 is formed by resist webs that remain after the exposure and the removal of the photoresist layer. By measuring distances between the first mark 1 and the second mark 2, it is possible to quantitatively determine how the exposure has been effected.

Figure 7A:
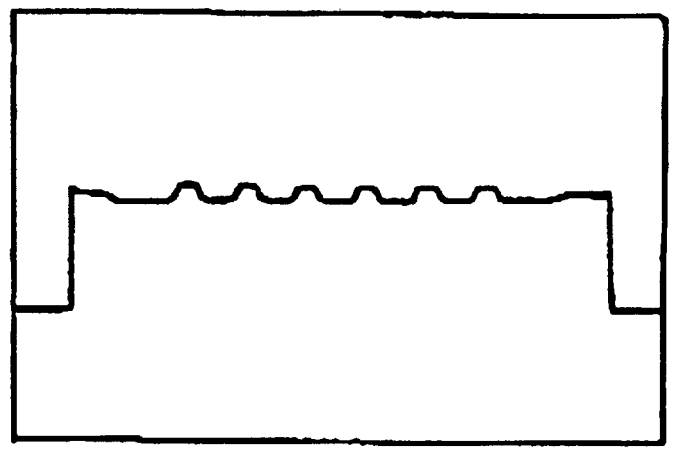
FIGS. 7A and 7B are illustrations showing a result of a measurement of the contrast of a mark configuration with and without a patterned background.
Figure 7B:
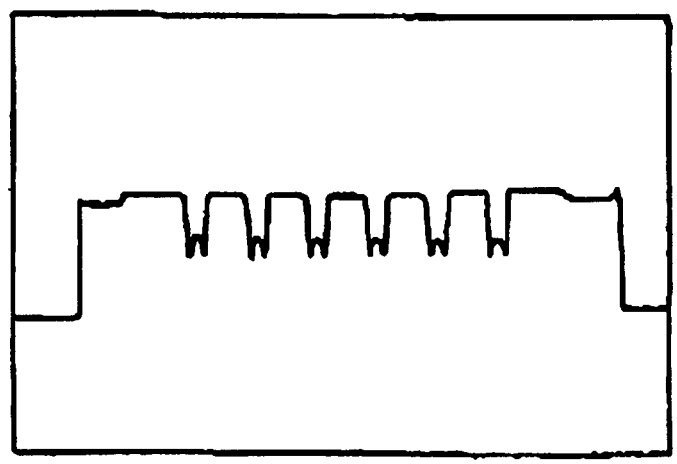

FIGS. 7A and 7B show the result of reflection measurements of the alignment marks 1 on the substrate.

In FIG. 7A, a standard mark is disposed on an unpatterned substrate. The differences in contrast between the alignment marks 1 (in this case containing six elements) and the background are small, which is expressed by the small, relatively wide (i.e. unsharp) peaks. The four perpendicular lines pass through the centroid formed by the edges of the peaks. Averaging over the centroids determined then produces the position of the entire alignment mark 1.

In contrast, FIG. 7B shows the measurement result for the alignment mark above a patterned background. The patterned background 11 is in this case formed by a regular configuration of deep trenches. The six elements of the alignment mark 1 in this case produce more distinct peaks (e.g. better edges), so that the position of the alignment mark 1 can be better determined.

A quantitative comparison shows that a mark configuration with an alignment mark 1 above a background patterned with deep trenches has a contrast that is improved by 50% compared with an unpatterned substrate.

The embodiment of the invention is not restricted to the preferred exemplary embodiments specified above. Rather, a number of variants are conceivable which make use of the mark configuration according to the invention, a wafer with the mark configuration or the method for the fabrication of the mark configuration in the case of embodiments of fundamentally different configuration as well.

We claim:

1. A mark configuration for at least one of orientation and determination of a relative position of at least one of a substrate and layers on the substrate during a lithographic exposure, the mark configuration comprising:
   a patterned background formed one of in and on the substrate; and
   a mark formed as a layer disposed above said patterned background, said mark increasing a difference in contrast between said mark and the substrate and being selected from the group consisting of an alignment mark and a tart of a measurement mark;
   said mark including a first mark and a second mark, said first mark formed form said layer being a first layer and said second mark formed as a second layer, said second mark being disposed above said patterned background, said second mark being disposed such that an orientation of said second layer with respect to said first layer can be quantitatively detected.

2. The mark configuration according to claim 1, wherein said first mark is an alignment mark, said first mark together with said second mark forming a measurement mark.

3. The mark configuration according to claim 1, wherein said patterned background is disposed below an entire extent of at least one of said first and second marks.

4. The mark configuration according to claim 1, wherein said patterned background has a pattern selected from the group consisting of a linear pattern and a grid-shaped pattern.

5. A mark configuration for at least one of orientation and determination of a relative position of at least one of a substrate and layers on the substrata during a lithographic exposure, the mark configuration comprising:
   a patterned background having at least one element whose reflectivity differs from that of the substrate formed one of in and on the substrate; and
   a mark having at least one part disposed above said patterned background, said mark increasing a difference in contrast between said mark and the substrate.

6. A mark configuration for at least one of orientation and determination of a relative position of at least one of a substrate and layers on the substrate during a lithographic exposure, the mark configuration comprising:

a patterned background formed one of in and on the substrate and be having at least one elevation made of at least one material selected from the group consisting of an oxide layer, monocrystalline silicon, polysilicon, aluminum, and copper;

a mark having at least one part disposed above said patterned background, said mark increasing a difference in contrast between said mark and the substrate.

7. The mark configuration according to claim 1, wherein the substrate has at least one depression formed therein and selected from the group consisting of a trench and a multiplicity of holes, said depression forming said patterned background.

8. The mark configuration according to claim 1, wherein a pattern of said patterned background extends parallel to an axis of one of said first and second marks.

9. The mark configuration according to claim 1, wherein said patterned background has individual elements with dimensions lying below a resolution limit of a measuring apparatus for detecting said first and second marks.

10. The mark configuration according to claim 1, wherein at least one of said first and second marks is disposed in a layer below a layer that is currently to be processed.

11. The mark configuration according to claim 1, wherein said mark is an alignment mark.

12. The mark configuration according to claim 3, wherein said second layer is a photoresist layer.

13. The mark configuration according to claim 1, wherein the substrate is a wafer for fabricating a dynamic random access memory.

14. The mark configuration according to claim 1, wherein a pattern of said patterned background extends perpendicular to a longitudinal axis of one of said first and second marks.

15. The mark configuration according to claim wherein said axis is a longitudinal axis.

16. A wafer made of a semiconductor material, comprising:

a substrate; and a mark configuration for at least one of orientation and determination of a relative position of at least one of the wafer and layers on the wafer during a lithographic exposure, said mark configuration including:

a patterned background formed one of in and on said substrate; and a mark formed as a layer disposed above maid patterned background, said mark increasing a difference in contrast between said mark and said substrate and being selected from the group consisting of an alignment mark and a part of a measurement mark;

said mark including a first mark and a second mark, said first mark formed from said layer being a first layer and said second mark formed as a second layer, said second mark being disposed above said patterned background, said second mark being disposed such that an orientation of said second layer with respect to said first layer can be quantitatively detected.

17. A method for fabricating at least one mark configuration, which comprises the steps of:

providing a substrate;

fabricating a patterned background one of on and in the substrate;

forming a mark as a layer and selecting the mark from the group consisting of an alignment mark and a part of a measurement mark;

forming a first mark from a first layer of the layer;

forming a second mark from a second layer of the layer; and disposing at least one part of the mark above the patterned background for producing an increased difference in contrast between the mark and the substrate, and disposed the second mark such that an orientation of the second layer with respect to the first layer can be quantitatively detected.

18. The method according to claim 17, which comprises:

forming the mark as a layer disposed above the patterned background.

19. The method according to claim 17, which comprises:

selecting the patterned background from the group consisting of a linear pattern and a grid-shaped pattern.

20. A method for fabricating at leapt one mark configuration which comprises the steps:

providing a substrate;

fabricating a patterned background one of on and in the substrate:

disposing at least one part of a mark above the patterned background for producing an increased difference in contrast between the mark and the substrate; and applying at learnt one element having a reflectivity differing from that of the substrate to the patterned background.

21. A method for fabricating at learnt one mark configuration, which comprises the steps of:

providing a substrate;

fabricating a patterned background one of on and in the substrate;

disposing at least one part of a mark above the patterned background for producing an increased difference in contrast between the mark and the substrate; and applying at least one elevation selected from the group consisting of an oxide layer, monocrystalline silicon, polysilicon, aluminum, and copper to the substrate for forming the patterned background.

22. The method according to claim 17, which comprises forming at least one depression selected from the group consisting of a trench and a multiplicity of holes in the substrate for forming the patterned background.

23. The method according to claim 17, which comprising forming the substrate from a semiconductor material.

* * * * *